US008581790B2

(12) United States Patent
Riley

(10) Patent No.: US 8,581,790 B2
(45) Date of Patent: Nov. 12, 2013

(54) TUNED DIRECTIONAL ANTENNAS

(75) Inventor: Philip Riley, Antioch, CA (US)

(73) Assignee: Trapeze Networks, Inc., Pleasanton, CA (US)

(*) Notice: Subject to any disclaimer, the term of this patent is extended or adjusted under 35 U.S.C. 154(b) by 578 days.

(21) Appl. No.: 12/603,542

(22) Filed: Oct. 21, 2009

(65) Prior Publication Data

US 2010/0103059 A1 Apr. 29, 2010

Related U.S. Application Data

(62) Division of application No. 11/451,704, filed on Jun. 12, 2006, now Pat. No. 7,844,298.

(51) Int. Cl.

| | |
|---|---|
| ***G01R 29/10*** | (2006.01) |
| ***H01Q 1/50*** | (2006.01) |
| ***H01Q 9/00*** | (2006.01) |

(52) U.S. Cl.

USPC ............................ 343/703; 343/861; 343/745

(58) Field of Classification Search

USPC .......................................... 343/703, 861, 745

See application file for complete search history.

(56) References Cited

U.S. PATENT DOCUMENTS

| | | | |
|---|---|---|---|
| 2,422,073 | A | 6/1947 | Bond |
| 3,641,433 | A | 2/1972 | Mifflin et al. |
| 4,168,400 | A | 9/1979 | de Couasnon et al. |
| 4,176,316 | A | 11/1979 | DeRosa et al. |
| 4,247,908 | A | 1/1981 | Lockhart, Jr. et al. |
| 4,291,401 | A | 9/1981 | Bachmann |
| 4,291,409 | A | 9/1981 | Weinberg et al. |
| 4,409,470 | A | 10/1983 | Shepard et al. |
| 4,460,120 | A | 7/1984 | Shepard et al. |
| 4,475,208 | A | 10/1984 | Ricketts |
| 4,494,238 | A | 1/1985 | Groth, Jr. |
| 4,500,987 | A | 2/1985 | Hasegawa |
| 4,503,533 | A | 3/1985 | Tobagi et al. |
| 4,550,414 | A | 10/1985 | Guinon et al. |
| 4,562,415 | A | 12/1985 | McBiles |
| 4,630,264 | A | 12/1986 | Wah et al. |
| 4,635,221 | A | 1/1987 | Kerr |

(Continued)

FOREIGN PATENT DOCUMENTS

| | | |
|---|---|---|
| WO | WO-9403986 | 2/1994 |
| WO | WO-9911003 | 3/1999 |

(Continued)

OTHER PUBLICATIONS

Acampora and Winters, IEEE Communications Magazine, 25(8):11-20 (1987).

(Continued)

*Primary Examiner* — Douglas W Owens
*Assistant Examiner* — Jennifer F Hu
(74) *Attorney, Agent, or Firm* — Harrity & Harrity, LLP

(57) ABSTRACT

A technique for improving radio coverage involves using interdependently tuned directional antennas. An example according to the technique is a substrate including two antennas, a transceiver, and a connector. Another example system according to the technique is a wireless access point (AP) including a processor, memory, a communication port, and a PCB comprising a plurality of directional antennas and a radio. An example method according to the technique involves determining a voltage standing wave ratio (VSWR) and interdependently tuning a first and second directional antenna to reach an expected radiation pattern.

15 Claims, 8 Drawing Sheets

(56) References Cited

U.S. PATENT DOCUMENTS

| | | | | |
|---|---|---|---|---|
| 4,639,914 | A | 1/1987 | Winters | |
| 4,644,523 | A | 2/1987 | Horwitz | |
| 4,672,658 | A | 6/1987 | Kavehrad et al. | |
| 4,673,805 | A | 6/1987 | Shepard et al. | |
| 4,707,839 | A | 11/1987 | Andren et al. | |
| 4,730,340 | A | 3/1988 | Frazier, Jr. | |
| 4,736,095 | A | 4/1988 | Shepard et al. | |
| 4,740,792 | A | 4/1988 | Sagey et al. | |
| 4,758,717 | A | 7/1988 | Shepard et al. | |
| 4,760,586 | A | 7/1988 | Takeda | |
| 4,789,983 | A | 12/1988 | Acampora et al. | |
| 4,829,540 | A | 5/1989 | Waggener, Sr. et al. | |
| 4,850,009 | A | 7/1989 | Zook et al. | |
| 4,872,182 | A | 10/1989 | McRae et al. | |
| 4,894,842 | A | 1/1990 | Broekhoven et al. | |
| 4,901,307 | A | 2/1990 | Gilhousen et al. | |
| 4,933,952 | A | 6/1990 | Albrieux et al. | |
| 4,933,953 | A | 6/1990 | Yagi | |
| 4,955,053 | A | 9/1990 | Siegmund | |
| 5,008,899 | A | 4/1991 | Yamamoto | |
| 5,029,183 | A | 7/1991 | Tymes | |
| 5,103,459 | A | 4/1992 | Gilhousen et al. | |
| 5,103,461 | A | 4/1992 | Tymes | |
| 5,109,390 | A | 4/1992 | Gilhousen et al. | |
| 5,142,550 | A | 8/1992 | Tymes | |
| 5,151,919 | A | 9/1992 | Dent | |
| 5,157,687 | A | 10/1992 | Tymes | |
| 5,187,575 | A | 2/1993 | Lim | |
| 5,231,633 | A | 7/1993 | Hluchyj et al. | |
| 5,280,498 | A | 1/1994 | Tymes et al. | |
| 5,285,494 | A | 2/1994 | Sprecher et al. | |
| 5,329,531 | A | 7/1994 | Diepstraten et al. | |
| 5,418,812 | A | 5/1995 | Reyes et al. | |
| 5,450,615 | A | 9/1995 | Fortune et al. | |
| 5,465,401 | A | 11/1995 | Thompson | |
| 5,469,180 | A * | 11/1995 | Wiggenhorn | 343/744 |
| 5,479,441 | A | 12/1995 | Tymes et al. | |
| 5,483,676 | A | 1/1996 | Mahany et al. | |
| 5,488,569 | A | 1/1996 | Kaplan et al. | |
| 5,491,644 | A | 2/1996 | Pickering et al. | |
| 5,517,495 | A | 5/1996 | Lund et al. | |
| 5,519,762 | A | 5/1996 | Bartlett | |
| 5,528,621 | A | 6/1996 | Heiman et al. | |
| 5,561,841 | A | 10/1996 | Markus | |
| 5,568,513 | A | 10/1996 | Croft et al. | |
| 5,584,048 | A | 12/1996 | Wieczorek | |
| 5,598,532 | A | 1/1997 | Liron | |
| 5,630,207 | A | 5/1997 | Gitlin et al. | |
| 5,640,414 | A | 6/1997 | Blakeney, II et al. | |
| 5,649,289 | A | 7/1997 | Wang et al. | |
| 5,668,803 | A | 9/1997 | Tymes et al. | |
| 5,793,303 | A | 8/1998 | Koga | |
| 5,794,128 | A | 8/1998 | Brockel et al. | |
| 5,812,589 | A | 9/1998 | Sealander et al. | |
| 5,815,811 | A | 9/1998 | Pinard et al. | |
| 5,828,960 | A | 10/1998 | Tang et al. | |
| 5,838,907 | A | 11/1998 | Hansen | |
| 5,844,900 | A | 12/1998 | Hong et al. | |
| 5,872,968 | A | 2/1999 | Knox et al. | |
| 5,875,179 | A | 2/1999 | Tikalsky | |
| 5,896,561 | A | 4/1999 | Schrader et al. | |
| 5,915,214 | A | 6/1999 | Reece et al. | |
| 5,920,821 | A | 7/1999 | Seazholtz et al. | |
| 5,933,607 | A | 8/1999 | Tate et al. | |
| 5,949,988 | A | 9/1999 | Feisullin et al. | |
| 5,953,669 | A | 9/1999 | Stratis et al. | |
| 5,960,335 | A | 9/1999 | Umemoto et al. | |
| 5,982,779 | A | 11/1999 | Krishnakumar et al. | |
| 5,987,062 | A | 11/1999 | Engwer et al. | |
| 5,987,328 | A | 11/1999 | Ephremides et al. | |
| 6,005,853 | A | 12/1999 | Wang et al. | |
| 6,011,784 | A | 1/2000 | Brown et al. | |
| 6,078,568 | A | 6/2000 | Wright et al. | |
| 6,088,591 | A | 7/2000 | Trompower et al. | |
| 6,119,009 | A | 9/2000 | Baranger et al. | |
| 6,119,032 | A | 9/2000 | Martin et al. | |
| 6,160,804 | A | 12/2000 | Ahmed et al. | |
| 6,188,649 | B1 | 2/2001 | Birukawa et al. | |
| 6,208,629 | B1 | 3/2001 | Jaszewski et al. | |
| 6,208,841 | B1 | 3/2001 | Wallace et al. | |
| 6,218,930 | B1 | 4/2001 | Katzenberg et al. | |
| 6,240,078 | B1 | 5/2001 | Kuhnel et al. | |
| 6,240,083 | B1 | 5/2001 | Wright et al. | |
| 6,256,300 | B1 | 7/2001 | Ahmed et al. | |
| 6,256,334 | B1 | 7/2001 | Adachi | |
| 6,285,662 | B1 | 9/2001 | Watanabe et al. | |
| 6,317,599 | B1 | 11/2001 | Rappaport et al. | |
| 6,336,035 | B1 | 1/2002 | Somoza et al. | |
| 6,336,152 | B1 | 1/2002 | Richman et al. | |
| 6,347,091 | B1 | 2/2002 | Wallentin et al. | |
| 6,356,758 | B1 | 3/2002 | Almeida et al. | |
| 6,393,290 | B1 | 5/2002 | Ufongene | |
| 6,404,772 | B1 | 6/2002 | Beach et al. | |
| 6,473,449 | B1 | 10/2002 | Cafarella et al. | |
| 6,493,679 | B1 | 12/2002 | Rappaport et al. | |
| 6,496,290 | B1 | 12/2002 | Lee | |
| 6,512,916 | B1 | 1/2003 | Forbes, Jr. | |
| 6,580,700 | B1 | 6/2003 | Pinard et al. | |
| 6,587,680 | B1 | 7/2003 | Ala-Laurila et al. | |
| 6,625,454 | B1 | 9/2003 | Rappaport et al. | |
| 6,631,267 | B1 | 10/2003 | Clarkson et al. | |
| 6,659,947 | B1 | 12/2003 | Carter et al. | |
| 6,661,787 | B1 | 12/2003 | O'Connell et al. | |
| 6,687,498 | B2 | 2/2004 | McKenna et al. | |
| 6,725,260 | B1 | 4/2004 | Philyaw | |
| 6,747,961 | B1 | 6/2004 | Ahmed et al. | |
| 6,839,338 | B1 | 1/2005 | Amara et al. | |
| 6,879,812 | B2 | 4/2005 | Agrawal et al. | |
| 6,933,909 | B2 | 8/2005 | Theobold | |
| 6,973,622 | B1 | 12/2005 | Rappaport et al. | |
| 6,978,301 | B2 | 12/2005 | Tindal | |
| 7,020,773 | B1 | 3/2006 | Otway et al. | |
| 7,110,756 | B2 | 9/2006 | Diener | |
| 7,190,974 | B2 | 3/2007 | Efland et al. | |
| 7,286,086 | B2 * | 10/2007 | Fang et al. | 343/700 MS |
| 7,567,213 | B2 | 7/2009 | Liu | |
| 7,844,298 | B2 | 11/2010 | Riley | |
| 7,865,213 | B2 | 1/2011 | Riley | |
| 2001/0020920 | A1 * | 9/2001 | Shigihara | 343/732 |
| 2002/0052205 | A1 | 5/2002 | Belostotsky et al. | |
| 2002/0095486 | A1 | 7/2002 | Bahl | |
| 2002/0101868 | A1 | 8/2002 | Clear et al. | |
| 2002/0174137 | A1 | 11/2002 | Wolff et al. | |
| 2003/0014646 | A1 | 1/2003 | Buddhikot et al. | |
| 2003/0018889 | A1 | 1/2003 | Burnett et al. | |
| 2003/0107590 | A1 | 6/2003 | Levillain et al. | |
| 2003/0174706 | A1 | 9/2003 | Shankar et al. | |
| 2004/0001467 | A1 | 1/2004 | Cromer et al. | |
| 2004/0025044 | A1 | 2/2004 | Day | |
| 2004/0064560 | A1 | 4/2004 | Zhang et al. | |
| 2004/0095914 | A1 | 5/2004 | Katsube et al. | |
| 2004/0108957 | A1 * | 6/2004 | Umehara et al. | 343/700 MS |
| 2004/0120370 | A1 | 6/2004 | Lupo | |
| 2004/0143428 | A1 | 7/2004 | Rappaport et al. | |
| 2004/0230370 | A1 | 11/2004 | Tzamaloukas | |
| 2004/0259555 | A1 | 12/2004 | Rappaport et al. | |
| 2005/0030929 | A1 | 2/2005 | Swier et al. | |
| 2005/0058132 | A1 | 3/2005 | Okano et al. | |
| 2005/0059405 | A1 | 3/2005 | Thomson et al. | |
| 2005/0059406 | A1 | 3/2005 | Thomson et al. | |
| 2005/0064873 | A1 | 3/2005 | Karaoguz et al. | |
| 2005/0068925 | A1 | 3/2005 | Palm et al. | |
| 2005/0073980 | A1 | 4/2005 | Thomson et al. | |
| 2005/0128989 | A1 | 6/2005 | Bhagwat et al. | |
| 2005/0157730 | A1 | 7/2005 | Grant et al. | |
| 2005/0180358 | A1 | 8/2005 | Kolar et al. | |
| 2005/0181805 | A1 | 8/2005 | Gallagher | |
| 2005/0193103 | A1 | 9/2005 | Drabik | |
| 2005/0223111 | A1 | 10/2005 | Bhandaru et al. | |
| 2005/0240665 | A1 | 10/2005 | Gu et al. | |
| 2005/0259597 | A1 | 11/2005 | Benedetto et al. | |
| 2005/0273442 | A1 | 12/2005 | Bennett et al. | |
| 2005/0276218 | A1 | 12/2005 | Ooghe et al. | |
| 2006/0045050 | A1 | 3/2006 | Floros et al. | |

(56) References Cited

U.S. PATENT DOCUMENTS

| | | | |
|---|---|---|---|
| 2006/0200862 A1 | 9/2006 | Olson et al. |
| 2007/0287390 A1 | 12/2007 | Murphy et al. |
| 2008/0036657 A1 | 2/2008 | Oomuro |

FOREIGN PATENT DOCUMENTS

| | | |
|---|---|---|
| WO | WO-03085544 A1 | 10/2003 |
| WO | WO-2004095192 A2 | 11/2004 |
| WO | WO-2004095800 A1 | 11/2004 |

OTHER PUBLICATIONS

Acampora and Winters, IEEE Journal on selected Areas in Communications. SAC-5:796-804 (1987).

Bing and Subramanian, IEEE, 1318-1322 (1997).

Durgin, et al., "Measurements and Models for Radio Path Loss and Penetration Loss in and Around Homes and Trees at 5.85 GHz", IEEE Transactions on Communications, vol. 46, No. 11, Nov. 1998.

Fortune et al., IEEE Computational Science and Engineering, "Wise Design of Indoor Wireless Systems: Practical Computation and Optimization", pp. 58-68 (1995).

Freret et al., Applications of Spread-Spectrum Radio to Wireless Terminal Communications, Conf. Record, Nat'l Telecom. Conf., Nov. 30-Dec. 4, 1980.

Geier, Jim, Wireless Lans Implementing Interoperable Networks, Chapter 3 (pp. 89-125) Chapter 4 (pp. 129-157) Chapter 5 (pp. 159-189) and Chapter 6 (pp. 193-234), 1999, United States.

Ho et al., "Antenna Effects on Indoor Obstructed Wireless Channels and a Deterministic Image-Based Wide-Based Propagation Model for In-Building Personal Communications Systems", International Journal of Wireless Information Networks, vol. 1, No. 1, 1994.

Kim et al., "Radio Propagation Measurements and Prediction Using Three-Dimensional Ray Tracing in Urban Environments at 908 MHz and 1.9 GHz", IEEE Transactions on Vehicular Technology, vol. 48, No. 3, May 1999.

Kleinrock and Scholl, Conference record 1977 ICC vol. 2 of 3, Jun. 12-15 Chicago Illinois "Packet Switching in radio Channels: New Conflict-Free Multiple Access Schemes for a Small Number of data Useres", (1997).

LAN/MAN Standards Committee of the IEEE Computer Society, Part 11:Wireless LAN Medium Access Control (MAC) and Physical Layer (PHY) Specifications: Higher Speed Physical Layer Extension in the 2.4 GHz Band, IEEE Std. 802.11b (1999).

Okamoto and Xu, IEEE, Proceeding so of the 13th Annual Hawaii International Conference on System Sciences, pp. 54-63 (1997).

Panjwani et al., "Interactive Computation of Coverage Regions for Wireless Communication in Multifloored Indoor Environments", IEEE Journal on Selected Areas in Communications, vol. 14, No. 3, Apr. 1996.

Perram and Martinez, "Technology Developments for Low-Cost Residential Alarm Systems", Proceedings 1997 Camahan Conference on Crime Countermeasures, Apr. 6-8, pp. 45-50 (1977).

Piazzi et al., "Achievable Accuracy of Site-Specific Path-Loss Predictions in Residential Environments", IEEE Transactions on Vehicular Technology, vol. 48, No. 3, May 1999.

Puttini, R., Percher, J., Me, L., and de Sousa, R. 2004. A fully distributed IDS for MANET. In *Proceedings of the Ninth international Symposium on Computers and Communications* 2004 vol. 2 (Iscc"04)—vol. 02 (Jun. 28-Jul. 1, 2004). ISCC. IEEE Computer Society, Washington, DC, 331-338.

Seidel et al., "Site-Specific Propagation Prediction for Wireless In-Building Personal Communications System Design", IEEE Transactions on Vehicular Technology, vol. 43, No. 4, Nov. 1994.

Skidmore et al., "Interactive Coverage Region and System Design Simulation for Wireless Communication Systems in Multi-floored Indoor Environments, SMT Plus" IEEE ICUPC '96 Proceedings (1996).

Ullmo et al., "Wireless Propagation in Buildings: A Statistic Scattering Approach", IEEE Transactions on Vehicular Technology, vol. 48, No. 3, May 1999.

Co-pending U.S. Appl. No. 11/451,704, filed Jun. 12, 2006.

Co-pending U.S. Appl. No. 12/629,867, filed Dec. 2, 2009.

Notice of Allowance Mailed Aug. 6, 2010, in Co-pending U.S. Appl. No. 11/451,704, filed Jun. 12, 2006.

Non-Final Office Action mailed Feb. 22, 2010, in Co-pending U.S. Appl. No. 11/451,704.

Non-Final Office Action dated Aug. 7, 2009, in co-pending U.S. Appl. No. 11/451,704, filed Jun. 12, 2006.

Non-Final Office Action mailed May 3, 2010, in Co-pending U.S. Appl. No. 12/629,867, filed Dec. 2, 2009.

* cited by examiner

TUNED DIRECTIONAL ANTENNAS

This application is a divisional of U.S. patent application Ser. No. 11/451,704, filed on Jun. 12, 2006, which is hereby incorporated by reference in its entirety.

BACKGROUND

Antennas can be divided into two groups: directional and non-directional. Directional antennas are designed to receive or transmit maximum power in a particular direction. Often, a directional antenna can be created by using a radiating element and a reflective element.

In use, directional antennas may have a disadvantage of protruding. Often, the protrusion is because the directional antennas are attached as a separate component. A possible problem with directional antennas is many directional antennas have been designed or have been tuned for a desired radiation pattern but are not tuned with respect to one another. An additional possible problem is directional antennas can be difficult to use in a device with an unobtrusive form factor.

Many antennas, both directional and non-directional, are designed to radiate most efficiently at a particular frequency or in a particular frequency range. An antenna may be tuned to influence the antennas radiation pattern at a frequency. A problem with tuning antennas is the resulting radiation pattern can be altered by the device the antenna is included in or may be sub-optimal for a location or a particular application.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools, and methods that are meant to be exemplary and illustrative, not limiting in scope. In various embodiments, one or more of the above-described problems have been reduced or eliminated, while other embodiments are directed to other improvements.

A technique for improving radio coverage involves using interdependently tuned directional antennas. A system according to the technique includes, a substrate with a transceiver, a plurality of directional antennas associated with the same electromagnetic radiation (EMR) frequency, and a connector. In some example embodiments, a plurality of directional antennas are interdependently tuned to achieve a desired radiation pattern. In some example embodiments, a second plurality of antennas can be included in the substrate associated with a second EMR frequency. In some example embodiments, the connector is a network interface. In some example embodiments, the individual directional antennas have different radiation patterns to achieve a desired combined radiation pattern.

Another system according to the technique is a wireless access point (AP) including a processor, memory, a communication interface, a bus, and a printed circuit board (PCB) comprising a radio and a plurality of antennas associated with a particular radio frequency. In some example embodiments, the antennas are interdependently tuned creating a desired and/or a generally optimal radiation pattern. In some example embodiments, the PCB includes a second plurality of antennas associated with a second radio frequency. In some example embodiments, the AP has an unobtrusive form factor. In some example embodiments, a plurality of antennas are tuned to a first frequency and individual antennas in the plurality will have different radiation patterns. In some example embodiments, the AP is operable as an untethered wireless connection to a network.

A method according to the technique involves interdependently tuning directional antennas. The method includes finding the desired voltage standing wave ratio (VSWR) for a first and second directional antenna, tuning the first and second directional antennas, measuring the combined radiation pattern of the first and second directional antennas, retuning the first and second directional antenna until the expected radiation pattern is achieved. In some example embodiments of the method, the radiation patterns are measured in the H and E plane. In some example embodiments of the method, the desired VSWR is determined by the desired and/or generally optimal radiation pattern of the first and second directional antennas. In some example embodiments of the method, the first and second directional antennas are tuned for different radiation patterns.

These and other advantages of the present invention will become apparent to those skilled in the art upon a reading of the following descriptions and a study of the several figures of the drawings.

BRIEF DESCRIPTION OF THE DRAWINGS

Embodiments of the invention are illustrated in the figures. However, the embodiments and figures are illustrative rather than limiting; they provide examples of the invention.

DETAILED DESCRIPTION

In the following description, several specific details are presented to provide a thorough understanding of embodiments of the invention. One skilled in the relevant art will recognize, however, that the invention can be practiced without one or more of the specific details, or in combination with other components, etc. In other instances, well-known implementations or operations are not shown or described in detail to avoid obscuring aspects of various embodiments, of the invention.

Figure 1:
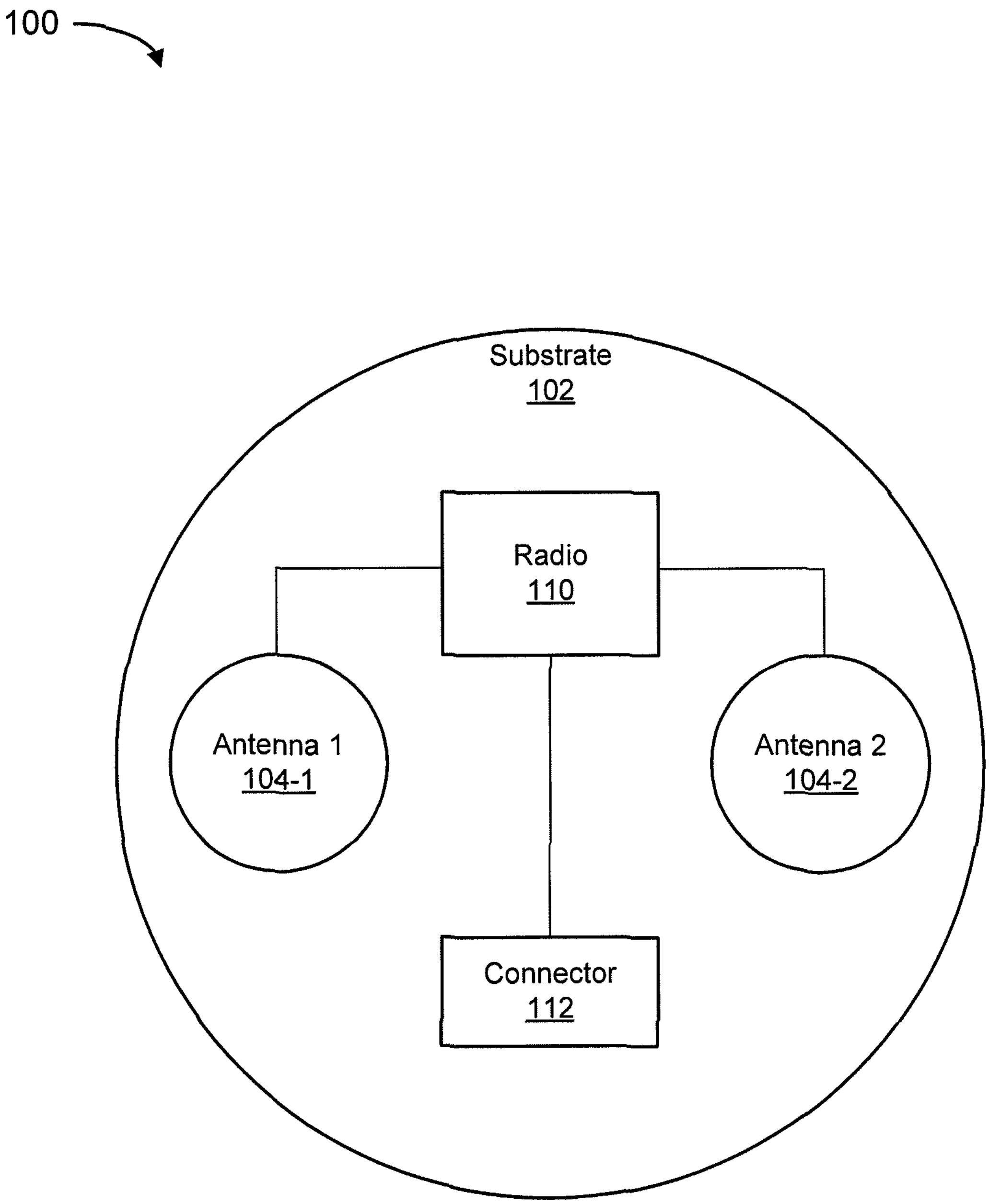
FIG. 1 depicts an example of a device including a substrate and multiple directional antennas.

FIG. 1 depicts an example of a device 100 including a substrate and multiple directional antennas. The device 100 includes the substrate 102, a first antenna 104-1, a second antenna 104-2, a transceiver 110, and a connector 112.

In the example of FIG. 1, the substrate 102 is a material capable of combining electrical components. In some example embodiments, a substrate is a non-conductive material. Non-limiting examples of possible non-conductive materials include phenolic resin, FR-2, FR-4, polyimide, polystyrene, cross-linked polystyrene, etc. Non-limiting examples of combining electrical components using a substrate include as a printed circuit board, attaching and soldering components, embedding the components in the substrate, or another way known or convenient.

In the example of FIG. 1, the first antenna 104-1 and the second antenna 104-2 (hereinafter collectively referred to as antennas 104) are coupled to the transceiver 110. The antennas 104 are directional and have maximum power in a particular direction. The directional antennas 104 are designed, configured, and/or modified to work most effectively when the antenna is approximately at an electromagnetic radiation (EMR) frequency or an EMR frequency range. Non-limiting examples of EMR frequencies include—900 MHz, 2.4 GHz, 5 GHz, etc.

In some example embodiments, a directional antenna includes a known or convenient reflecting element and a known or convenient radiating element. In some example embodiments, a plurality of directional antenna arrays may be included in the substrate with each array associated with a different frequency. The first directional antenna 104-1 and the second directional antenna 104-2 may form one of the plurality of antenna arrays or a portion of one of the plurality of antenna arrays.

In some example embodiments, a plurality of directional antennas can be included in a substrate with each antenna pointed in a different direction. In some example embodiments, two directional antennas included in a substrate are pointed in opposite or approximately opposite directions to cover a maximum or an approximately maximum horizontal area. In some example embodiments, the combined covered area by two directional antennas will be greater than would be possible using non-directional antennas of similar size, shape, material and/or cost.

In some example embodiments, antennas can be interdependently tuned to achieve a desired radiation pattern. Tuning antennas is well known to one skilled in the art. Interdependently tuning the antenna involves tuning the antenna considering the combined radiation pattern of a plurality of antennas, rather than the radiation pattern of an individual antenna. In some example embodiments, the antennas can be tuned interdependently considering a range of frequencies in which the antenna will operate.

In the example of FIG. 1, the transceiver 110 is coupled to the first antenna 104-1, the second antenna 104-2, and the connector 112. The transceiver 110 is capable of detecting transmissions received by one or more antennas or sending transmissions from one or more antennas.

In some example embodiments, a transceiver is designed to detect and send transmissions in an EMR frequency range or of one or more types of transmissions. For example a transceiver could be designed to work specifically with transmissions using 802.11a, 802.11b, 802.11g, 802.11n, short wave frequencies, AM transmissions, FM transmissions, etc. A known or convenient transceiver may be used.

In some example embodiments, a transceiver may include one or more transceivers. Alternatively or in addition, the transceiver may operate on multiple bands to detect multiple frequency ranges, to detect multiple types of transmissions, and/or to add redundancy. In some example embodiments, a transceiver is coupled to a plurality of directional antennas and is able to detect or send transmissions using the plurality of directional antennas. In some example embodiments, a transceiver is coupled to a plurality of antennas and the transceiver uses, for example, the antenna receiving the strongest signal. In some example embodiments, a transceiver includes a processor and memory.

In the example of FIG. 1, the connector 112 is coupled to the transceiver 110. The connector 112 is a network interface capable of electronic communication using a network protocol with another device or system. Non-limiting examples of other devices or systems include—a computer, a wireless access point, a network, a server, a switch, a relay, etc. The transceiver 110 is able to send or receive data from the connector 112. Data received from the transceiver 110 can be forwarded on to a connected electronic system.

In some embodiments, data may be modified when received or sent by a connector. Non-limiting examples of modifications of the data include stripping out routing data, breaking the data into packets, combining packets, encrypting data, decrypting data, formatting data, etc.

In some example embodiments, a connector includes a processor, memory coupled with the processor, and software stored in the memory and executable by the processor.

Figure 2A:
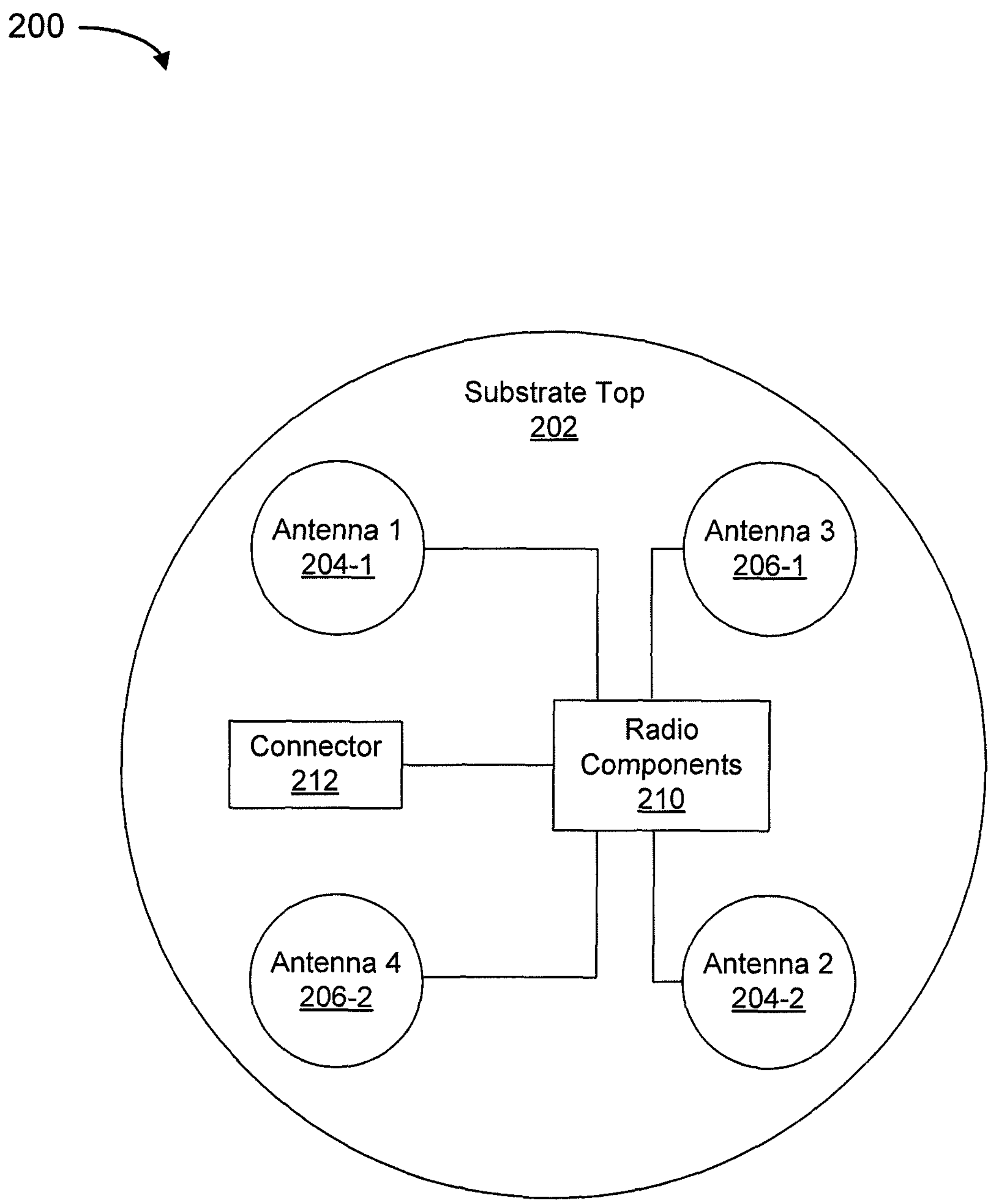
FIGS. 2A and 2B depict an example of a device including a substrate and four directional antennas.
Figure 2B:
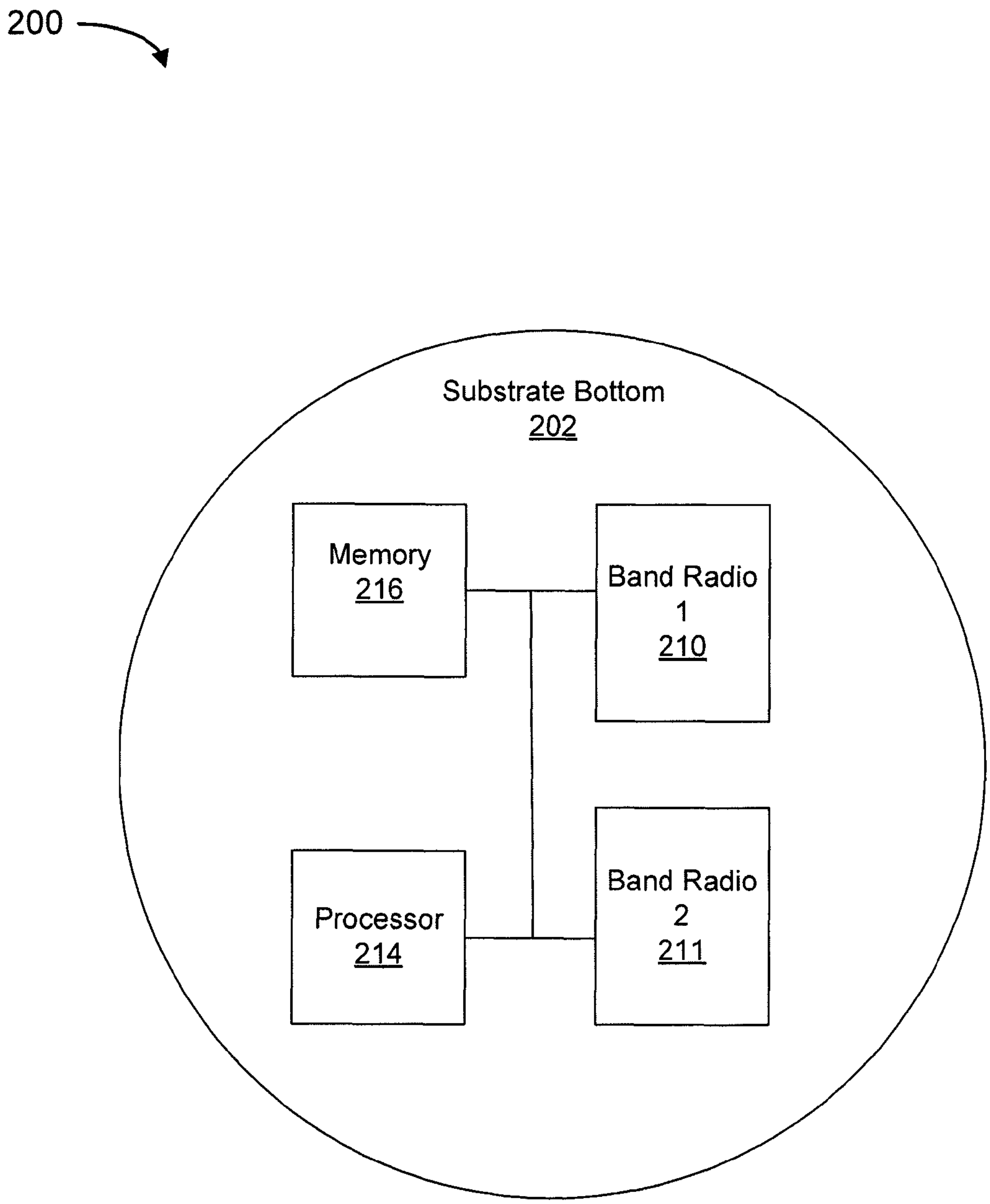

FIGS. 2A and 2B depict an example of a device 200 including a substrate and four directional antennas. FIG. 2A is intended to depict a top portion of the device 200, and FIG. 2B is intended to depict a bottom portion of the device 200. In the example of FIG. 2A, the device 200 includes a substrate top 202, a first antenna 204-1, a second antenna 204-2, a third antenna 206-1, a fourth antenna 206-2, radio components 210 and a connector 212. The figure depicts the top of a system showing physical components included in the substrate 202 and is meant to be interpreted in conjunction with FIG. 2B.

In the example of FIG. 2A, the substrate top 202 may be similar to the substrate 102 referenced above (see FIG. 1). In the example of FIG. 2A, the first antenna 204-1 and second antenna 204-2 are directional and associated with a first frequency. The first antenna 204-1 and the second antenna 204-2 may be any known or convenient directional antenna and are similar to the first antenna 104-1 and the second antenna 104-2 referenced above (see FIG. 1). In the example of FIG. 2A, the third antenna 206-1 and fourth antenna 206-2 are directional and associated with a second frequency. The third antenna 206-1 and the fourth antenna 206-2 may be a known or convenient directional antenna and are similar to the first antenna 104-1 and the second antenna 104-2 referenced above (see FIG. 1).

In some example embodiments, antennas associated with different frequency ranges can be interdependently tuned. Interdependently tuning uses the combined radiation pattern of a plurality of antennas at a frequency or in a frequency range while they are being tuned.

In the example of FIG. 2A, the radio components 210 couple the first antenna 204-1, the second antenna 204-2 to a radio associated with a first frequency band or data type, and the radio components 210 couple the third antenna 206-1 and fourth antenna to the to a radio associated with a second frequency band or data type. The radio components 210 may be a known or convenient combination of electrical components. The radio components 210 may include by way of example but not limitation transistors, capacitors, resistors, multiplexers, wiring, registers, diodes or any other electrical components known or convenient.

In some example embodiments, a radio and a coupled antenna will be associated with the same frequency or frequency band. In some example embodiments, a plurality of coupled antennas are interdependently tuned creating a combined radiation pattern that results in beneficial coverage area for an intended, possible, or known or convenient use of the radio. In some example embodiments, a plurality of antennas are interdependently tuned to achieve a generally optimal radiation pattern. Some examples of radiation patterns are described later with reference to FIGS. 5-8.

FIG. 2B depicts the bottom of an example system 200 for use with the top of the example system shown in FIG. 2A including a substrate bottom 202, a first band radio 214, a second band radio 216, a processor 220 and memory 222. The figure depicts the bottom of a system showing physical components included in the substrate bottom 202 and is meant to be interpreted in conjunction with FIG. 2A.

In the example of FIG. 2B, the substrate bottom 202 may be similar to the substrate 102 referenced above (FIG. 1).

In the example of FIG. 2B, the first band radio 214 and the second band radio 216 may detect or send data on an antenna. The first band radio 214 and the second band radio 216 are each coupled to a plurality of directional antennas (shown in FIG. 2A). The first band radio 214 and second band radio 216 are able to detect data transmissions on associated antennas and transmit data on associated antennas.

In some example embodiments, a band radio is designed to detect transmissions over an antenna which are near a frequency or in a frequency range. In some example embodiments, a substrate includes a plurality of band radios. Each of the band radios are associated with a wireless communication standard and used to communicate with clients using the associated wireless communication standard. Non-limiting examples of wireless communication standards include—802.11a, 802.11b, 802.11g, 802.11n, 802.16, or another wireless network standard known or convenient. In some example embodiments, a band radio is coupled with a plurality of directional antennas and the band radio is capable of using the directional antenna with the strongest transmission signal for wireless communication with a client. In some example embodiments, a band radio determines which of a plurality of coupled directional antennas to transmit data to a client through by determining the antenna receiving the strongest signal from the client. In an alternative example embodiment, a band radio sends a data transmission on all coupled antennas regardless of the signal strength received from the client. In some example embodiments, a band radio is designed to detect a certain type of transmissions. Non-limiting examples of transmission types include—802.11a, 802.11b, 802.11g, 802.11n, AM, FM, shortwave, etc.

In some example embodiments, data sent or received may be modified by a band radio. Non-limiting examples of modifications of the data include—stripping out some or all of the routing data, breaking the data into packets, combining packets, encrypting data, decrypting data, formatting data, etc.

In the example of FIG. 2B, the processor 220 and the memory 222 are coupled and the memory stores software executable by the processor. Additionally, the processor 220 and memory 222 are coupled with the first band radio 214 and the second band radio 216. The memory is capable of storing data received from the first band radio 214 and/or the second band radio 216. The memory may be any combination of volatile or non-volatile memory known or convenient. Non-limiting examples of non-volatile memory include—flash, tape, magnetic disk, etc. Non-limiting examples of volatile memory include—RAM, DRAM, SRAM, registers, cache, etc. Non-limiting examples of processors include—a general purpose processor, a special purpose processor, multiple processors working as one logical processor, a processor and other related components, a microprocessor or another known or convenient processor.

In some example embodiments, software stored in memory is capable of managing one or more clients associated with an AP. In some example embodiments, software stored in memory schedules data transmissions to a plurality of clients. In some example embodiments, software included in memory facilitates buffering of received data until the data can be wirelessly transmitted to a client. In some example embodiments, software included in memory is capable of transmitting data simultaneously to a plurality of clients using a plurality of band radios.

Figure 3:
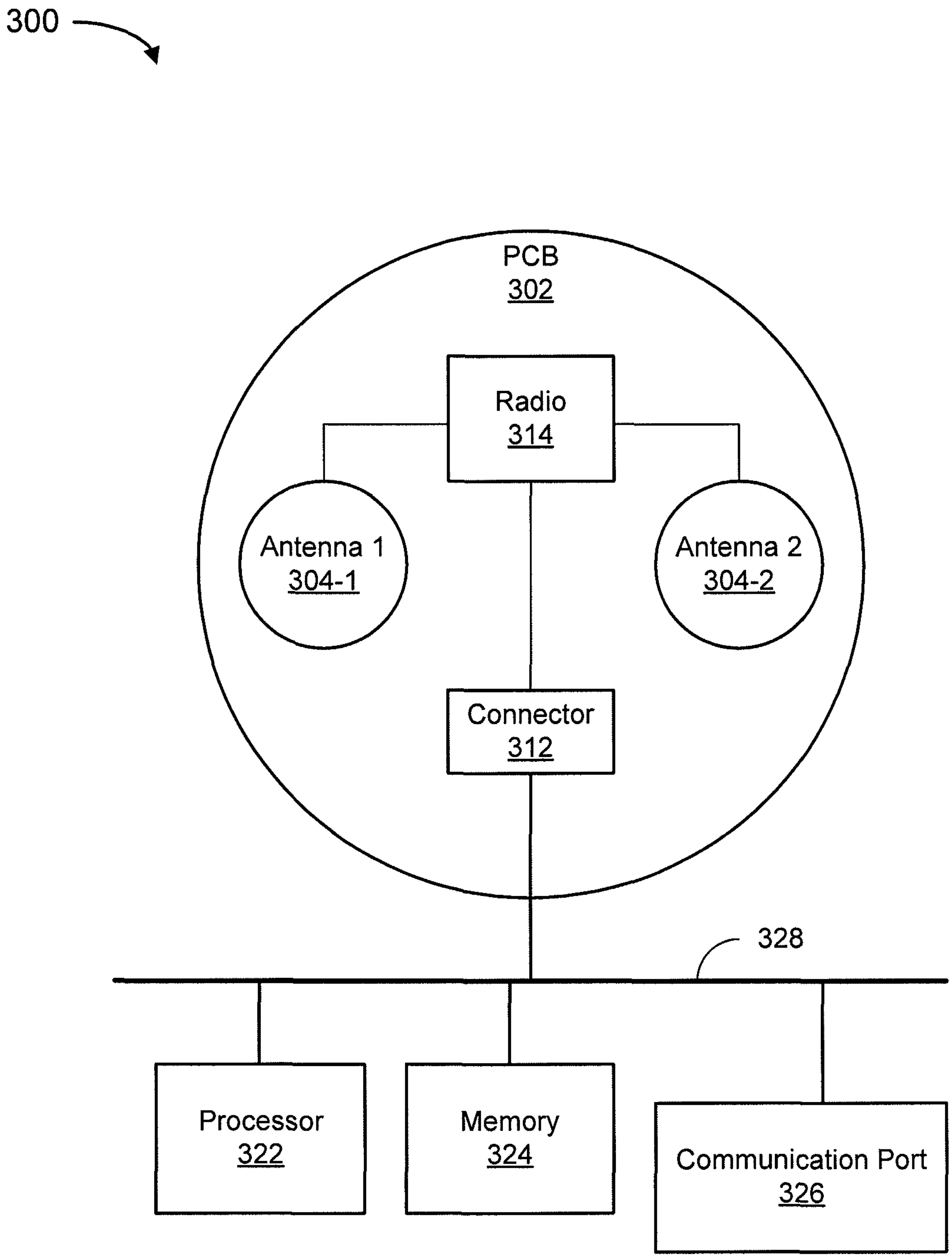
FIG. 3 depicts an example of a wireless access point (AP) with multiple antennas.

FIG. 3 depicts an example of a wireless access point (AP) with multiple antennas. The wireless access point (AP) 300 includes PCB 302 comprising a first antenna 304-1, a second antenna 304-2, and a radio 314, the AP 300 also includes a processor 322, memory 324, a communication interface 326, and a bus 328.

The AP 300 may operate as tethered and/or untethered. An AP operating as tethered uses one or more wired communication lines for data transfer between the AP and a network and uses a wireless connection for data transfers between the AP and a client. An AP operating as untethered uses a wireless connection with a network for data transfer between an AP and the network as well as using the wireless connection or a second wireless connection for data transfer with the client. In both tethered and untethered operation, an AP allows clients to communicate with a network. Clients may be a device or system capable of wireless communication with the AP 300. Non-limiting examples of clients include—desktop computers, laptop computers, PDAs, tablet PCs, servers, switches, wireless access points, etc. Non-limiting examples of wireless communication standards include—802.11a, 802.11b, 802.11g, 802.11n, 802.16, etc.

In some example embodiments, an AP may operate as tethered and untethered simultaneously by operating tethered for a first client and untethered for a second client. In some example embodiments, an AP is not connected to any wired communication or power lines and the AP will operate untethered. The AP may be powered by a battery, a solar cell, wind turbine, etc. In some example embodiments, a plurality of untethered AP may operate as a mesh where data is routed wirelessly along a known, convenient, desired or efficient route. The plurality of APs may be configured to calculate pathways using provided criteria or internal logic included in the APs.

When the AP 300 operates as an untethered wireless AP the first antenna 304-1, the second antenna 304-2, and the radio 314 may operate as the communication interface 326. In these cases there may be no need for additional components for the communication interface 326.

In some example embodiments, an AP has an unobtrusive form factor. An unobtrusive form factor depends on the use of the AP. Non-limiting examples of unobtrusive form factors include—a small size, a uniform shape, no protruding parts, fitting flush to the environment, being similar in shape to other common devices such as a smoke detector, temperature control gauges, light fixtures, etc. In some example embodiments, an AP is designed to work on a ceiling. Non-limiting examples of how an AP is designed for a ceiling include—attachment points on the AP suited for a ceiling, a radiation pattern pointed horizontally with little vertical gain, lightweight for easier installation, etc. In some example embodiments, an AP is designed for usage in different environmental conditions. Non-limiting examples include—a weather resistant casing, circuitry deigned for wide temperature ranges, moisture resistant, etc.

In the example of FIG. 3, the PCB 302 is a board composed of a non-conductive substrate which connects electronic components using conductive pathways. A PCB is often designed in layers, allowing sheets of conductive material to be separated by layers of non-conductive substrate. Non-limiting examples of conductive pathways include—copper or copper alloys, lead or lead alloys, tin or tin alloys, gold or gold alloys, or another metal or metal alloy known or convenient. Non-limiting examples of non-conductive substrates include—phenolic resin, FR-2, FR-4, polyimide, polystyrene, cross-linked polystyrene, or another non-conductive substrate known or convenient.

In some example embodiments, electrical components included on a PCB are selected and/or arranged to achieve a generally optimal and/or desired radiation pattern for a plurality of antennas included on the PCB. In some example embodiments, a plurality of antennas included on a PCB are interdependently tuned with the material of the PCB, the conductive pathways, and/or electrical components included on the PCB as factors in tuning the antennas to a generally optimal and/or desired radiation pattern.

In the example of FIG. 3, the first antenna 304-1 and the second antenna 304-2 are antennas included as electrical components in the PCB 302. The first antenna 304-1 and the second antenna 304-2 are coupled with the radio 314 using conductive pathways included in the PCB 302 (see PCB 302 above). The first antenna 304-2 and the second antenna 304-2 are associated with a frequency or a frequency range and have been designed, modified or tuned to work efficiently at the frequency or the frequency range. The first antenna 304-1 and second antenna 304-2 are directional and are designed and/or intended to radiate or receive signals more effectively in some directions then in other directions.

In an example embodiment, the first antenna 304-1 and the second antenna 304-2 may be directional antennas that are interdependently tuned for a desired radiation pattern. In a further example embodiment, a first directional antenna and a second directional antenna are interdependently tuned for a generally optimal radiation pattern.

In an example embodiment, the first antenna 304-1 and the second antenna 304-2 are part of a first plurality of directional antennas, each antenna in the plurality associated with a radio frequency. In some example embodiments, a plurality of directional antennas each associated with a second radio frequency are included in a PCB.

In an example embodiment, the first antenna 304-1 and the second antenna 304-2 are directional to a different degree so the first antenna has a longer and/or narrower radiation pattern compared to the second antenna. In an example embodiment, a plurality of directional antennas are included in a PCB to achieve a desired and/or generally optimal combined radiation pattern. The plurality of directional antennas may be directional to varying degrees to achieve the desired and/or generally optimal combined radiation pattern.

In the example of FIG. 3, the radio 314 is included in the PCB 302 and is coupled to the first antenna 304-1, the second antenna 304-2, and the bus 328. The radio 314 may communicate data via radio waves by inducing or detecting changes on the first antenna 304-1 and/or the second antenna 304-2. The radio 314 may communicate using the bus 328 to other devices similarly coupled to the bus 328. The operation of a radio is well known to a person skilled in the art.

In some example embodiments, a radio is designed to operate more effectively at or near a particular frequency or in a particular frequency range. For example, a radio may operate more effectively at 900 MHz, 2.4 GHz, 5 GHz, etc. A radio may also be designed to operate more effectively with a certain transmission standard, data type or format. For example, a radio may operate more effectively with 802.11a, 802.11b, 802.11g, 802.11n, or another wireless standard known or convenient.

In some example embodiments, a radio is considered when interdependently tuning a plurality of antennas to a generally optimal radiation pattern. In some example embodiments, the effectiveness of the radio in detecting and transmitting radio transmissions at a frequency, near a frequency or in a frequency range is taken into consideration when tuning an antenna or interdependently tuning a plurality of antennas.

In the example of FIG. 3, the bus 328 may be any data bus known or convenient. The bus 328 couples the radio 314, the processor 322, memory 324, and the communication port 326. The bus 328 allows electronic communication between coupled devices. A bus is well known to a person skilled in the art.

In the example of FIG. 3, the processor 322 is coupled to the radio 314, the memory 324, and the communication port 326 via the bus 328. The processor 322 may be a general purpose processor, a special purpose processor, multiple processors working as one logical processor, a processor and other related components, or another known or convenient processor. The processor 322 can execute software stored in the memory 324. A processor is well known to a person skilled in the art.

In the example of FIG. 3, the memory 324 is coupled to the processor 322, the radio 314, the memory 324, and the communication port 326 via the bus 328. The memory may be a combination of volatile or non-volatile memory known or convenient. Non-limiting examples of non-volatile memory include—flash, tape, magnetic disk, etc. Non-limiting examples of volatile memory include—RAM, DRAM, registers, cache, etc. The memory 324 is coupled to the processor 322, and the memory stores software executable by the processor. Memory is well known to a person skilled in the art.

In some example embodiments, memory and/or a processor are included on a PCB. In some example embodiments, components of the memory and/or processor are included on a PCB.

In the example of FIG. 3, the communication interface 326 is coupled to the processor 322, the radio 314, and the memory 324. The communication interface 326 may communicate data electronically to an external network, system or device. The communication port 326 does not necessarily require a separate component and may include the first directional antenna 304-1, the second directional antenna 304-2 and the radio 314. Non-limiting examples of communication interfaces include—a wireless radio, an Ethernet port, a coaxial cable port, a fiber optics port, a phone port, or another known or convenient communication interface or combination of communication interfaces.

Figure 4:
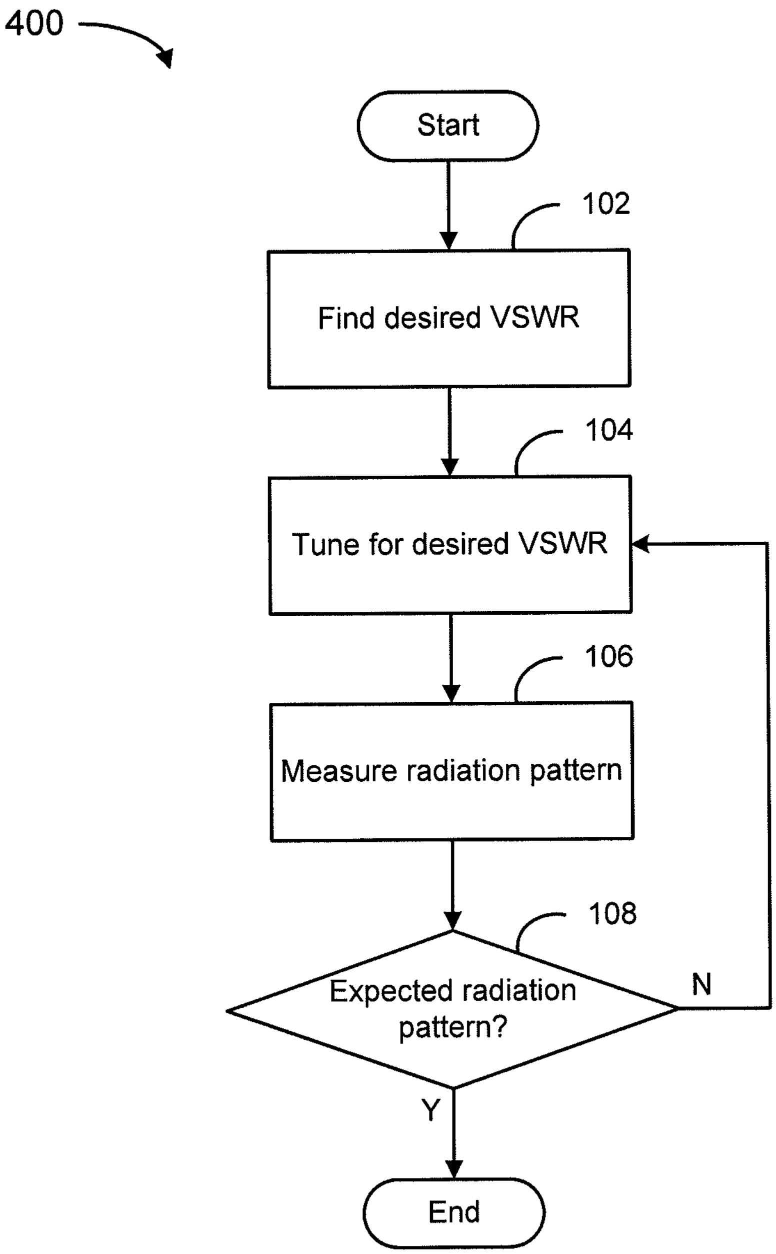
FIG. 4 depicts a flowchart of an example of a method for interdependently tuning directional antennas.

FIG. 4 depicts a flowchart 400 of an example of a method for interdependently tuning directional antennas. This method and other methods are depicted as serially arranged modules. However, modules of the methods may be reordered, or arranged for parallel execution as appropriate.

In the example of FIG. 4, the flowchart 400 starts at module 402 where a desired voltage standing wave ration (VSWR) for a first directional antenna and a second directional antenna is found. A desired VSWR may be found using, by way of example but not a limitation, a network analyzer.

In the example of FIG. 4, the flowchart 400 continues at module 404 where the first directional antenna and the second directional antenna are tuned for the desired VSWR. Tuning the first directional antenna and the second directional antenna involves modifying connected electrical components until the desired VSWR is attained.

In the example of FIG. 4, the flowchart 400 continues at module 406 where a combined radiation pattern of the first directional antenna and the second directional antenna is measured. The combined radiation pattern can be measured at a variety of radio frequencies depending on the intended use of the antennas.

In some embodiments of the example method, measuring a radiation pattern can be done in the H plane and or the E plane. In some embodiments of the example method, measuring the radiation pattern will only be done in one plane or may be done with more weight given to the radiation pattern in one plane and may be determined by the intended usage of the antennas, the antennas orientation, and where the antenna will be mounted.

In the example of FIG. 4, the flowchart 400 continues to decision point 408 where it is determined whether the measured combined radiation pattern was equivalent to an expected radiation pattern. If the radiation pattern is equal or within an acceptable margin of error from the expected radiation pattern (408-Y) then the flowchart 400 ends. If the radiation pattern deviates from the expected radiation pattern (408-N) the flowchart 400 continues at module 404, as described previously.

Advantageously, the use of two antenna arrays facilitates providing maximum coverage on two bands, such as by way of example but not limitation, the 802.11b/g and the 802.11a bands. This coverage may be accomplished by positioning the two antenna arrays so that their maximum directivity are at right angles, or approximately at right angles (which may or may not include an exactly 90 degree angle), to each other. In another embodiment, each band may use two antennas with overlapping antenna patterns. The combined pattern may provide excellent horizontal plane directivity.

Advantageously, the antenna arrays may be placed together on a substrate, such as by way of example but not limitation, a PCB assembly. This placement may facilitate the tuning of the interdependent antennas. Advantageously, the substrate and interdependent antennas facilitates the creation of an AP that can be ceiling mounted with limited board space. In an embodiment that includes excellent horizontal plane directivity, this can be valuable in typical indoor setting. The directivity of the interdependent antenna may also facilitate better coverage in other settings, such as out of doors. It may be desirable to include an enclosure on the AP to protect the AP from the elements in an out-of-doors configuration.

FIGS. 5-8 are intended to illustrate some examples of coverage facilitated by the techniques described herein. FIGS. 5-8 are graphical depictions of a radiation pattern showing the relative field strength of the antenna as an angular function with respect to the axis. The strength is measured in decibel (dB) gain at a frequency. The radiation pattern depicts higher gain in some directions using combined radiation patterns of a first and a second directional antenna compared to a perfect isotropic antenna. Large dB values in a direction generally indicate a greater covered area in the direction for applications involving radio transmissions. Whether the first antenna or the second antenna actually receives the strongest signal will depend on additional factors such as the environment, noise, constructive interference and destructive interference.

Figure 5:
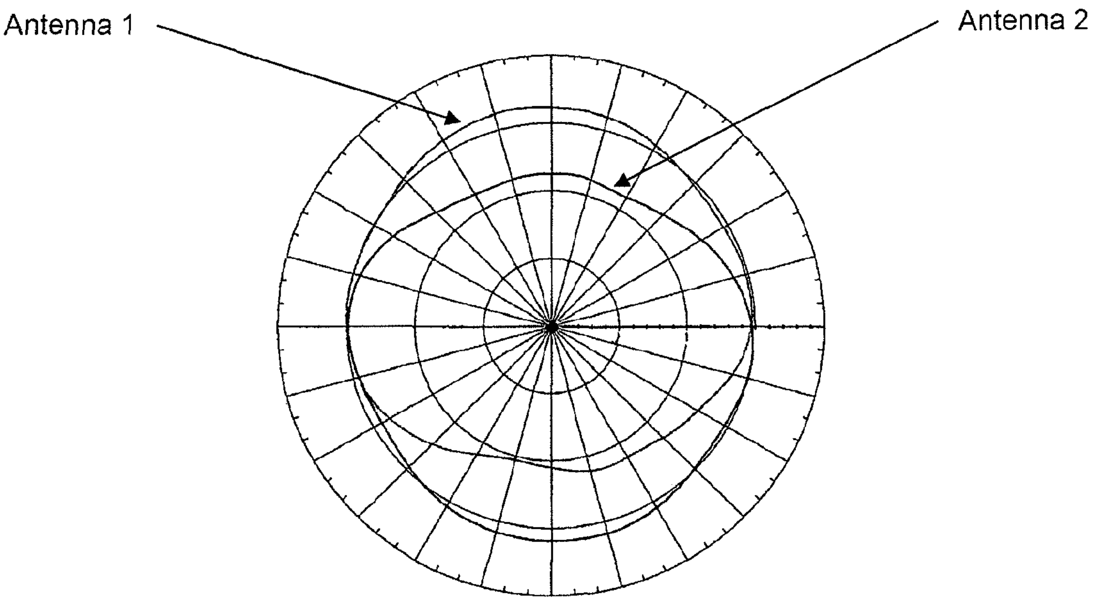
FIG. 5 depicts an example radiation pattern of a first directional antenna and a second directional antenna associated with a frequency 2.4 GHz in an H plane.

FIG. 5 depicts an example radiation pattern of a first directional antenna and a second directional antenna associated with a frequency 2.4 GHz in an H plane. A higher gain in a direction generally means a greater coverage in the direction. For example, if the shown radiation pattern was associated with an AP using the 802.11g wireless standard, an angle indicating a higher gain would generally mean a client using the 802.11g standard at the angel could be farther from the AP than if the client was at an angle with a low gain and still communicate with the AP. As can be seen in FIG. 5, a positive gain may be achieved in some directions through the combined radiation pattern of two directional antennas. In some example embodiments, the H plane may approximate a horizontal plane.

Figure 6:
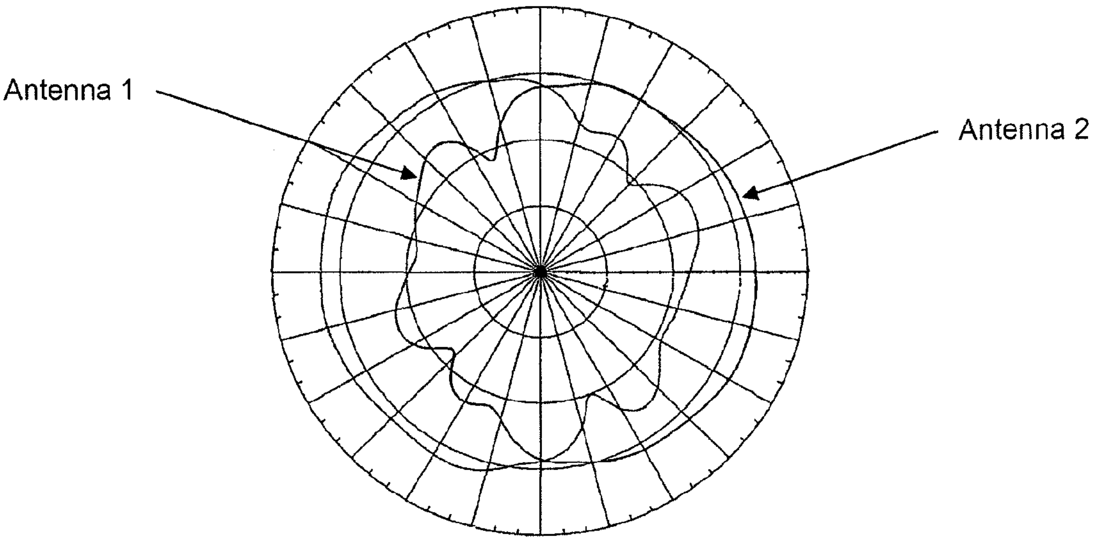
FIG. 6 depicts an example radiation pattern of a first directional antenna and a second directional antenna associated with a frequency 5 GHz in an H plane.

FIG. 6 depicts an example radiation pattern of a first directional antenna and a second directional antenna associated with a frequency 5 GHz in an H plane. A higher gain in a direction generally means a greater coverage in the direction. For example, if the shown radiation pattern was associated with an AP using the 802.11a wireless standard, an angle indicating a higher gain would generally mean a client using the 802.11a standard at the angel could be farther from the AP than if the client was at an angle with a low gain and still communicate with the AP. As can be seen in FIG. 5, a positive gain may be achieved in some directions through the combined radiation pattern of two directional antennas. In general, an AP associated with 5 GHz will have a different coverage area than an AP associated with 2.4 GHz as shown above in FIG. 5. In some example embodiments, the H plane may approximate a horizontal plane.

Figure 7:
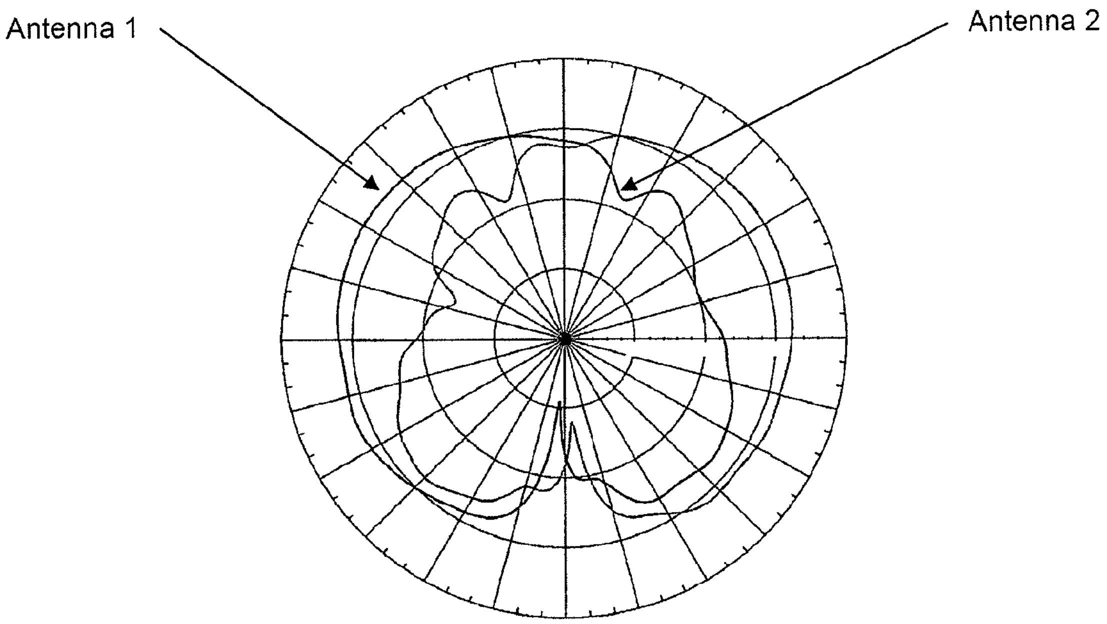
FIG. 7 depicts an example radiation pattern of a first directional antenna and a second directional antenna associated with a frequency 2.4 GHz in an E plane.

FIG. 7 depicts an example radiation pattern of a first directional antenna and a second directional antenna associated with a frequency 2.4 GHz in an E plane. A higher gain in a direction generally means a greater coverage in the direction. In some example embodiments, the E plane may approximate a vertical plane. In some example embodiments, the radiation pattern in the E plane may be less important than the radiation pattern in the H plane because the horizontal coverage may be more important than the vertical coverage in covering an area in which a relatively high number of wireless clients can be found.

Figure 8:
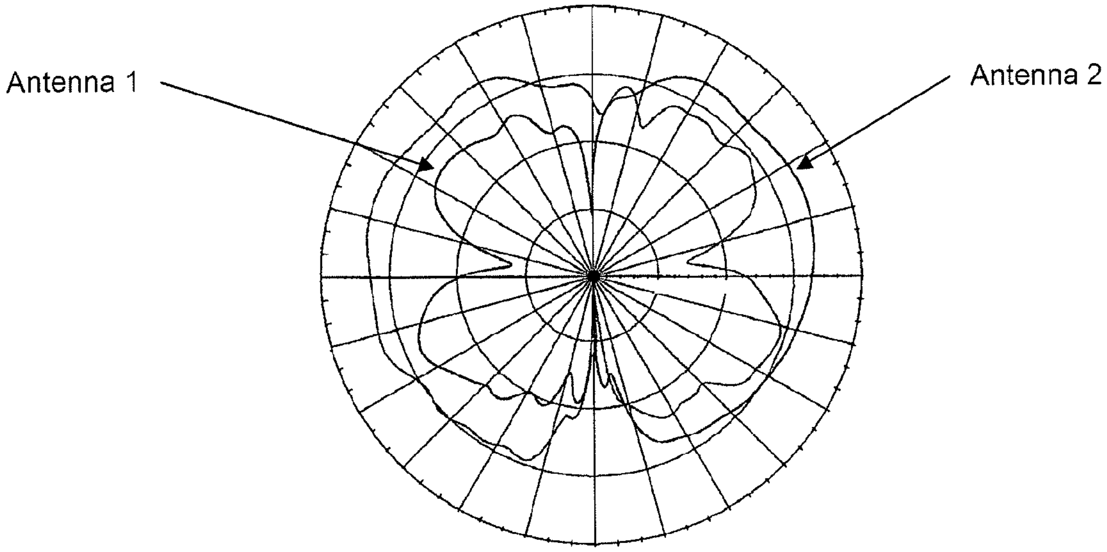
FIG. 8 depicts an example radiation pattern of a first directional antenna and a second directional antenna associated with a frequency 5 GHz in an E plane.

FIG. 8 depicts an example radiation pattern of a first directional antenna and a second directional antenna associated with a frequency 5 GHz in an E plane. A higher gain in a direction generally means a greater coverage in the direction. In some example embodiments, the E plane may approximate a vertical plane. In some example embodiments, the radiation pattern in the E plane may be less important than the radiation pattern in the H plane because the horizontal coverage may be more important than the vertical coverage. In general, a 5 GHz device will have a different coverage area than a 2.4 GHz device.

An example of a coverage area includes covering a maximum area possible by increasing gain as much as feasible both downward and in a horizontal direction. This may be beneficial in large rooms such as auditoriums. For example, in an auditorium or other high-ceilinged room, if the device is affixed to the ceiling, gain must be sufficiently high in a downward direction, as well as in horizontal directions, to ensure that coverage includes all areas of the auditorium. For example, the highest gain may be desirable in an oblique direction (e.g., approximately in the direction of the baseboard of an auditorium). On the other hand, in typical or relatively low-ceilinged rooms, gain can be relatively high in a more horizontal direction, but relatively low in a downward direction, since a client that is directly under the device will be relatively close to the device. Another example of coverage includes covering a long narrow area by focusing gain in a horizontal direction or directions. This may be beneficial for rooms such as hallways, long rooms, narrow rooms, or when there is interference in a direction. A narrow coverage could also be beneficial for an AP that is not able to be installed at an area where coverage is desired, the AP could be installed away from the area and a positive gain could be focused at the area. Another example of coverage includes mixing narrow coverage with wider coverage and would be beneficial for rooms which have mixed large and narrow areas. Mixing coverage could also be beneficial for an untethered AP where a narrow coverage could be focused at another AP while more completely covering an area close to the AP. The preceding examples are meant as examples only and there are other beneficial uses or combinations of coverage areas.

Figure 9:
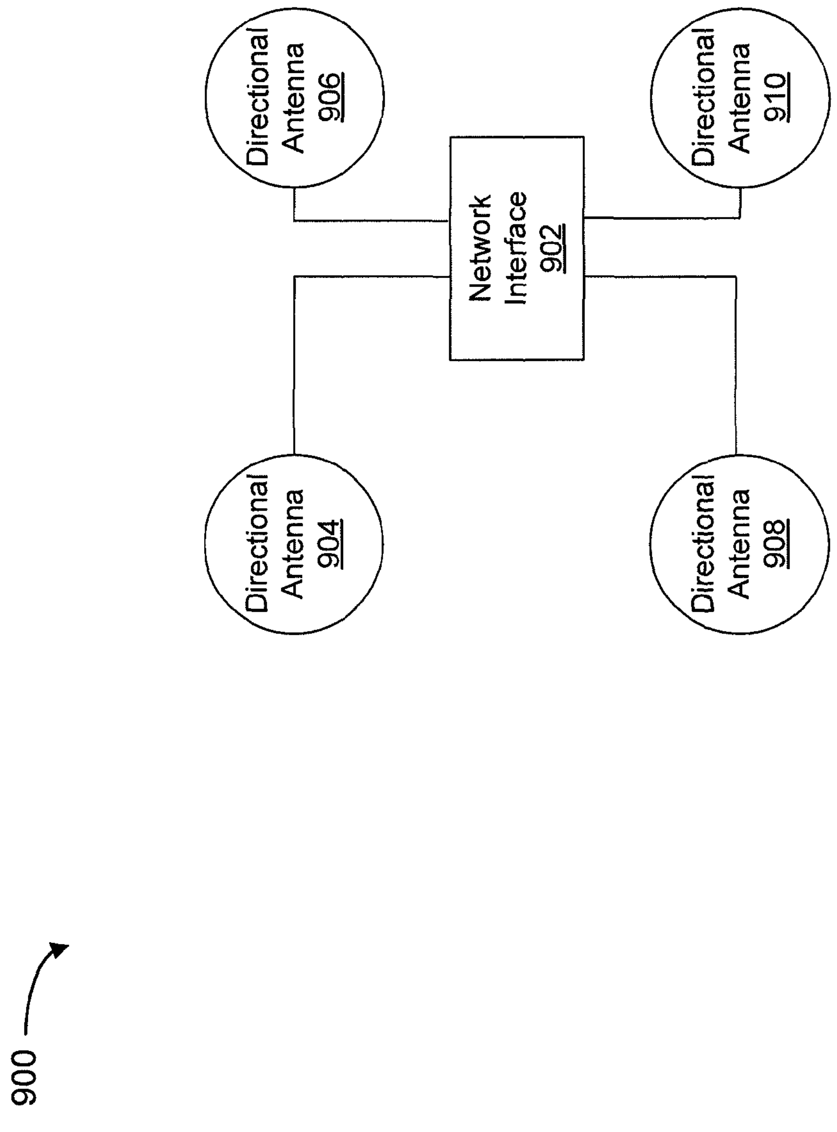
FIG. 9 is a picture of a tunable wireless access point prototype.

FIG. 9 is a picture of an example embodiment of a wireless access point. The picture includes a first directional antenna, a second directional antenna, a third directional antenna, a fourth directional antenna, and a network interface. The first and second directional antennas are associated with a first frequency. The third and fourth antennas are associated with a second frequency.

As used herein, the term "embodiment" means an embodiment that serves to illustrate by way of example but not limitation.

The term "desired radiation pattern" is intended to mean a radiation pattern of an antenna or a combined radiation pattern of a plurality of antennas which is selected for any reason. Factors considered may be internal or external to the antenna or the plurality of antennas. Non-limiting examples of internal factors in a desired radiation pattern include—maximum or approximately maximum possible coverage, noise, legal requirements, cost, intended use, etc.

The term "optimal radiation pattern" is intended to mean a radiation pattern of an antenna or a combined radiation pattern of a plurality of antennas which creates the largest coverage of an horizontal or a vertical area when considering one or more factors external to the antenna or the plurality of antennas. Internal factors may still be used in conjunction with the one or more factors external to the antenna. Non-limiting examples of external factors considered for a "optimal radiation pattern" include—use, operating conditions, environment, interference from other sources, the placement, temperature ranges, the power level, noise, legal requirements, etc.

The term "covered area" and "coverage" are intended to mean an area in which a wireless signal can be detected at a level at which the signal can be practically used. The actual coverage area of an antenna can vary depending on the noise, power, receiving device, application, frequency, interference, etc. In most cases "coverage area" and "coverage" are used herein as a relative term and only the aspects of the antenna need be considered.

The term "network" is any interconnecting system of computers or other electronic devices. Non-limiting examples of networks include—a LAN, a WAN, a MAN, a PAN, the internet, etc.

The term "Internet" as used herein refers to a network of networks which uses certain protocols, such as the TCP/IP protocol, and possibly other protocols such as the hypertext transfer protocol (HTTP) for hypertext markup language (HTML) documents that make up the World Wide Web (the web). The physical connections of the Internet and the protocols and communication procedures of the Internet are well known to those of skill in the art.

It will be appreciated to those skilled in the art that the preceding examples and embodiments are exemplary and not limiting to the scope of the present invention. It is intended that all permutations, enhancements, equivalents, and improvements thereto that are apparent to those skilled in the art upon a reading of the specification and a study of the drawings are included within the true spirit and scope of the present invention. It is therefore intended that the following appended claims include all such modifications, permutations and equivalents as fall within the true spirit and scope of the present invention.

The invention claimed is:

1. A method, performed by one or more devices, the method comprising:

tuning, by the one or more devices and based on a first Voltage Standing Wave Ratio (VSWR) measured for a first directional antenna, the first directional antenna for a particular VSWR, the first directional antenna being tuned for a first radiation pattern;

tuning, by the one or more devices and based on a second VSWR measured for a second directional antenna, the second directional antenna for the particular VSWR, the second directional antenna being tuned for a second radiation pattern that is more narrow than the first radiation pattern;

measuring, by the one or more devices, a combined radiation pattern of the first directional antenna and the second directional antenna;

determining, by the one or more devices, whether the measured combined radiation pattern matches a particular radiation pattern; and when the measured combined radiation pattern does not match the particular radiation pattern:

re-tuning, by the one or more devices, the first directional antenna for the particular VSWR;

re-tuning, by the one or more devices, the second directional antenna for the particular VSWR;

measuring, by the one or more devices, a second combined radiation pattern of the first directional antenna and the second directional antenna;

determining, by the one or more devices, whether the second combined radiation pattern matches the particular radiation pattern; and repeating, by the one or more devices, the re-turning of the first directional antenna, the re-turning of the second directional antenna, the measuring, and the determining until a combined radiation pattern of the first directional antenna and the second directional antenna matches the particular radiation pattern.

2. The method of claim 1, where measuring the combined radiation pattern includes:

measuring radiation patterns for the first directional antenna and the second directional antenna in an H plane or an E plane.

3. The method of claim 1, where the particular VSWR is determined based on a radiation pattern of a wireless access point.

4. The method of claim 1, where measuring the combined radiation pattern includes:

measuring the combined radiation pattern in a first plane and in a second plane.

5. The method of claim 4, where measuring the combined radiation pattern includes:

weighting second radiation patterns corresponding to a radiation pattern in the second plane; and measuring the combined radiation pattern based on first radiation patterns, corresponding to a radiation pattern in the first plane, and the weighted second radiation patterns.

6. The method of claim 5, where weighting the second radiation patterns includes weighting the second radiation patterns based on one of an intended usage of the first directional antenna and the second directional antenna, an orientation of the first directional antenna and the second directional antenna, or locations at which the first directional antenna and the second directional antenna are mounted.

7. A system including:
one or more devices to:
tune, based on a first Voltage Standing Wave Ratio (VSWR) measured for a first directional antenna, the first directional antenna for a particular VSWR,
the first directional antenna being tuned for a first radiation pattern;
tune, based on a second VSWR measured for a second directional antenna,
the second directional antenna for the particular VSWR,
the second directional antenna being tuned for a second radiation pattern that is more narrow than the first radiation pattern;
measure a combined radiation pattern of the first directional antenna and the second directional antenna;
determine that the measured combined radiation pattern matches a particular radiation pattern; and
when the measured combined radiation pattern does not match the particular radiation pattern, the one or more devices are further to:
re-tune the first directional antenna for the particular VSWR,
re-tune the second directional antenna for the particular VSWR,
measure a second combined radiation pattern of the first directional antenna and the second directional antenna,
determine whether the second combined radiation pattern matches the particular radiation pattern, and
repeat the re-turning of the first directional antenna, the re-turning of the second directional antenna, the measuring, and the determining until the combined radiation pattern of the first directional antenna and the second directional antenna matches the particular radiation pattern.

8. The system of claim 7, where, when measuring the combined radiation pattern, the one or more devices are further to:
measure radiation patterns for the first directional antenna and the second directional antenna in an H plane or an E plane.

9. The system of claim 7, where the particular VSWR is determined based on a radiation pattern of a wireless access point.

10. The system of claim 7, where, when measuring the combined radiation pattern, the one or more devices are further to:
measure the combined radiation pattern in a first plane and in a second plane.

11. The system of claim 10, where, when measuring the combined radiation pattern, the one or more devices are further to:
weight second radiation patterns corresponding to a radiation pattern in the second plane; and
measure the combined radiation pattern based on first radiation patterns, corresponding to a radiation pattern in the first plane, and the weighted second radiation patterns.

12. The system of claim 11, where, when weighting the second radiation patterns, the one or more devices are to weight the second radiation patterns based on one of an intended usage of the first directional antenna and the second directional antenna, an orientation of the first directional antenna and the second directional antenna, or locations at which the first directional antenna and the second directional antenna are mounted.

13. A system comprising:
a first antenna;
a second antenna; and
a device to:
tune the first antenna for a particular Voltage Standing Wave Ratio (VSWR) for a first radiation pattern;
tune the second antenna for the particular VSWR for a second radiation pattern, the second radiation pattern being more narrow than the first radiation pattern;
measure a combined radiation pattern of the first antenna and the second antenna after tuning the first antenna and the second antenna;
determine whether the measured combined radiation pattern matches a particular radiation pattern; and
when the combined radiation pattern does not match the particular radiation pattern, repeat the tuning of the first antenna, the tuning of the second antenna, the measuring of the combined radiation pattern, and the determining of whether the measured combined radiation pattern matches the particular radiation pattern until the combined radiation pattern matches the particular radiation pattern.

14. The system of claim 13, where, when measuring the combined radiation pattern, the device is further to:
measure radiation patterns for the first antenna and the second antenna in an H plane or an E plane.

15. The system of claim 13, where the first antenna includes a first directional antenna and where the second antenna includes a second directional antenna.

* * * * *